US011428345B2

(12) United States Patent
Cordelair (10) Patent No.: US 11,428,345 B2
(45) Date of Patent: Aug. 30, 2022

(54) MICRO CHECK VALVE AND SYSTEM WITH MULTIPLE MICRO CHECK VALVES AND METHOD FOR THE PRODUCTION THEREOF

(71) Applicant: MICROFAB SERVICE GMBH, Bremen (DE)

(72) Inventor: Marco Cordelair, Tarmstedt (DE)

(73) Assignee: MICROFAB SERVICE GMBH, Bremen (DE)

( * ) Notice: Subject to any disclaimer, the term of this patent is extended or adjusted under 35 U.S.C. 154(b) by 340 days.

(21) Appl. No.: 16/630,328

(22) PCT Filed: Jul. 11, 2017

(86) PCT No.: PCT/EP2017/067316
§ 371 (c)(1),
(2) Date: Jan. 10, 2020

(87) PCT Pub. No.: WO2019/011410
PCT Pub. Date: Jan. 17, 2019

(65) Prior Publication Data
US 2020/0166156 A1     May 28, 2020

(51) Int. Cl.
*F16K 15/14*     (2006.01)
*F16K 99/00*     (2006.01)
(Continued)

(52) U.S. Cl.
CPC .......... *F16K 99/0057* (2013.01); *B81B 3/007* (2013.01); *B81B 3/0013* (2013.01);
(Continued)

(58) Field of Classification Search
CPC ............ F16K 99/0057; F16K 99/0015; F16K 2099/0074; F16K 2099/008;
(Continued)

(56) References Cited

U.S. PATENT DOCUMENTS 4,712,583 A * 12/1987 Pelmulder ............. A61M 39/24
137/859
4,895,500 A * 1/1990 Hok ..................... F16K 99/0057
417/413.1
(Continued)

FOREIGN PATENT DOCUMENTS

DE     69722798 T2     4/2004
GB     2155152 A     9/1985
(Continued)

*Primary Examiner* — Minh Q Le
(74) *Attorney, Agent, or Firm* — Wood Herron & Evans LLP (57) ABSTRACT

A micro check valve includes a substrate body having a top side and an underside, at least the top side having a sealing bar between a first trough and a second trough. The substrate body also has a passage which leads from the underside of the substrate body to the top side of the substrate body and ends on the top side of the substrate body in the first trough. In addition arranged on the top side of the substrate body is a diaphragm which is mounted flexibly at least in the region of the sealing bar and the first and second troughs. The diaphragm also has at least one through opening arranged above the second trough.

18 Claims, 7 Drawing Sheets

(51) Int. Cl.
   *B81B 3/00* (2006.01)
   *B81C 1/00* (2006.01)

(52) U.S. Cl.
   CPC ...... *B81C 1/00658* (2013.01); *B81C 1/00968* (2013.01); *F16K 99/0015* (2013.01); *B81B 2201/054* (2013.01); *B81B 2203/0127* (2013.01); *B81B 2203/0163* (2013.01); *B81C 2201/013* (2013.01); *B81C 2201/0105* (2013.01); *B81C 2201/0178* (2013.01); *F16K 2099/008* (2013.01); *F16K 2099/0074* (2013.01); *F16K 2099/0086* (2013.01)

(58) Field of Classification Search
   CPC ........... F16K 2099/0086; B81B 3/0013; B81B 3/007; B81B 2201/054; B81B 2203/0127; B81B 2203/0163; B81C 1/00658; B81C 1/00968; B81C 2201/0105; B81C 2201/013; B81C 2201/0178
   USPC ..... 137/846, 315.33, 512.4, 859, 863, 614.2
   See application file for complete search history.

(56) References Cited

U.S. PATENT DOCUMENTS

| | | | |
|---|---|---|---|
| 5,058,856 A * | 10/1991 | Gordon | F15C 5/00 251/11 |
| 5,121,840 A * | 6/1992 | Schram | F16K 15/144 137/859 |
| 5,325,880 A | 7/1994 | Johnson et al. | |
| 6,089,272 A * | 7/2000 | Brand | F16K 15/144 137/859 |
| 6,237,619 B1 * | 5/2001 | Maillefer | F16K 99/0001 137/859 |
| 6,334,761 B1 | 1/2002 | Tai et al. | |
| 7,997,293 B2 * | 8/2011 | Ruschke | F16K 15/144 210/430 |
| 8,251,099 B2 * | 8/2012 | Carmody | F16K 15/144 137/859 |
| 8,291,936 B2 * | 10/2012 | Carmody | F16K 15/144 137/859 |
| 9,421,354 B2 * | 8/2016 | Carmody | A61M 5/165 |
| 10,274,094 B2 * | 4/2019 | Hatami Aghdam | F04B 53/102 |
| 10,478,818 B1 * | 11/2019 | Ball | B01L 3/502707 |
| 2007/0026269 A1 | 2/2007 | Nakakubo | |
| 2007/0163664 A1 * | 7/2007 | Mijers | A61M 39/24 137/859 |
| 2007/0251592 A1 * | 11/2007 | Christenson | F16K 99/0009 137/859 |
| 2008/0035875 A1 * | 2/2008 | Tai | F16K 99/0005 29/890.122 |
| 2010/0137784 A1 * | 6/2010 | Cefai | F16K 99/0001 604/131 |
| 2014/0166140 A1 * | 6/2014 | Santos | F16K 99/0015 137/859 |
| 2014/0264650 A1 | 9/2014 | Liu et al. | |
| 2015/0001653 A1 | 1/2015 | Schelling et al. | |
| 2018/0149289 A1 * | 5/2018 | Geovanos | F16K 99/0005 |
| 2018/0353977 A1 * | 12/2018 | Nijdam | B05B 1/14 |
| 2020/0109048 A1 * | 4/2020 | Lee | H04R 31/003 |
| 2020/0139368 A1 * | 5/2020 | Mou | F16K 99/0048 |

FOREIGN PATENT DOCUMENTS

| | | |
|---|---|---|
| GB | 2443260 A | 4/2008 |
| WO | 97/05385 | 2/1997 |

* cited by examiner

MICRO CHECK VALVE AND SYSTEM WITH MULTIPLE MICRO CHECK VALVES AND METHOD FOR THE PRODUCTION THEREOF

CROSS-REFERENCE TO RELATED APPLICATION

This application is a national phase entry of, and claims priority to, International Application No. PCT/EP2017/067316, filed Jul. 11, 2017, with the same title as listed above. The above-mentioned patent application is incorporated herein by reference in its entirety.

TECHNICAL FIELD

The invention concerns a micro check valve and a system having a plurality of micro check valves and a method for the production thereof.

BACKGROUND

Check valves, which are also referred to as check fitments, are known from the state of the art. Check valves permit a fluid flow through the check valve in a predefined direction, while the return flow, that is to say the flow in the opposite direction, is prevented by a blocking mechanism or at least the flow quantity is reduced.

Check valves are known in the field of microsystem technology, which are produced by hybrid production using a substrate. For example, German Patent Publication No. DE 697 22 798 T2 discloses microvalves which have a substrate having a passage through the substrate. At one end of the passage a thin layer of a rolled metal film is joined to the substrate by anode welding. That metal film has a plurality of openings which are disposed radially outside the passage.

Accordingly a fluid which flows through the passage in a direction towards the film can flow out through the openings in the metal film. A return flow is not possible as a pressure difference in the reverse direction, that is to say an increased pressure above the metal film outside the passage in comparison with the pressure in the passage provides that the metal film presses against the passage opening and thus closes it.

Such micro check valves are known for example for medical uses in order to pass for example controlled amounts of medication from a reservoir into an area of application, wherein the blocking action prevents extraneous fluids from penetrating from the area of application into the medication reservoir.

The above-mentioned anode welding or anodic welding technology with which the metal film is fixed to the substrate is effected at temperatures in the region of a few hundred degrees Celsius. Corresponding joints produced by that method can therefore also come loose again at such temperatures. Therefore the known micro check valves are not suitable for high-temperature uses.

There are moreover approaches for producing check valves by monolithic integration as a microsystem, in which case the previous solutions which include freely moveable structures are not suitable for safety-relevant applications, for example also in the medical area, in particular by virtue of their in part inadequate closing action. Thus, it would be desirable to provide a micro check valve and a system therewith and a method for the production thereof, so as to provide a reliable micro check valve which can preferably also be used in the field of high-temperature applications.

SUMMARY

According to one embodiment, a micro check valve is provided having a substrate body which has a top side and an underside. At least the top side has a first trough and a second trough. A sealing bar is arranged between the first trough and the second trough. The troughs preferably respectively correspond to a recess in the substrate. The sealing bar can also be referred to as a bar having a sealing surface or sealing element and separates the internal spaces encompassed by the two troughs from each other. Depending on the respective spacing of the troughs from each other the sealing bar is thus of a corresponding width.

In addition the substrate body has at least one passage which leads from the top side of the substrate body to the underside of the substrate body and represents a through opening between the top side and the underside of the substrate body. The at least one passage ends on the top side in the first trough or opens into same. In the case of a plurality of passages all passages end in the first trough.

In addition on its top side the substrate body includes a diaphragm which preferably comprises a nitride layer. The diaphragm is preferably formed by a deposited layer which is therefore produced by a deposition process, in particular an LPCVD-, PECVD-, sputtering or vapor deposition process.

The diaphragm is in part freely moveable and/or flexible. Thus the diaphragm is directly or indirectly connected to the substrate body in such a way that it is moveable at least in the region above the first trough, the sealing bar and the second trough in the direction of a normal vector relative to the surface of the substrate body with respect to the substrate body. The diaphragm is therefore only in part directly or indirectly rigidly connected to the surface of the substrate body so that it is unconnected, therefore not connected, to permit mobility, in the region of the troughs and the sealing bar. The diaphragm therefore forms in the region of the sealing bar in conjunction with the sealing bar a kind of valve in order to permit or prevent or minimize a fluid flow or an aerosol flow from the first trough into the second trough or vice-versa depending on the respective position of the diaphragm.

The diaphragm also has at least one through opening arranged above the second trough. The through opening is therefore disposed above the second trough, that is to say in the region of the diaphragm, that is above the second trough.

Accordingly there is proposed a micro check valve which does not have any freely moveable elements and which for switching and blocking purposes has recourse to a flexible diaphragm which in an outer region of an active portion of the micro check valve is in part connected to the substrate by a deposition process and thus has only predefined degrees of freedom in terms of the movement. In addition the micro check valve is produced by the deposited diaphragm by virtue of monolithic integration. Accordingly the micro check valve can be used in high-temperature applications, for example in applications in the region above 350° C. If the diaphragm is preferably deposited by an LPCVD- or PECVD-process applications in the temperature range of over 500° C. are also possible.

According to a first embodiment the first trough is in the form of a first recess in the substrate body and is preferably delimited by the sealing bar. The first recess is preferably round, in particular circular. The second trough is in the form of a second recess, extending around the first recess, in the substrate body, preferably being of an annular, in particular circular-annular configuration. In that arrangement the first trough is separated from the second trough by the sealing bar in circumferentially extending relationship, wherein the sealing bar is preferably of an annular, in particular circular-annular configuration.

Accordingly therefore the first recess and the second recess preferably have center points which are disposed substantially at the same position. The second recess preferably has an inside circle diameter and the first recess has an outside circle diameter which is less than the inside circle diameter of the second recess so that an annular bar is formed between the annular recess and the round recess, that corresponds to the sealing bar and can also be referred to as a sealing element or sealing ring.

According to a further embodiment the first trough with the diaphragm defines an inner chamber and the second trough with the diaphragm defines an outer chamber. In addition the sealing bar forms a valve with the diaphragm, adapted substantially to prevent or reduce a fluid flow or an aerosol flow between the inner chamber and the outer chamber.

A liquid or an aerosol can thus flow through the at least one passage into the inner chamber and, in the situation where the diaphragm is pressed against the sealing bar, therefore the bar between the troughs, it can be prevented from further flow. If in contrast the diaphragm moves in the direction of the normal to the substrate body surface then it no longer bears against the sealing bar and the liquid or the aerosol can flow into the second chamber. The liquid or the aerosol can then flow into the periphery of the micro check valve through the through opening or openings in the diaphragm above the second trough, that is to say in the second chamber.

A through opening accordingly corresponds to a communicating passage between the periphery of the micro check valve, that is to say the outer surroundings, and the second chamber which is substantially enclosed by the second recess and the diaphragm.

According to a further embodiment the micro check valve has an opened and a closed state. The micro check valve is also adapted to assume the opened state when a pressure difference of the fluid or aerosol between a pressure in the at least one passage and a pressure above the diaphragm is at or above a predefined minimum pressure difference. In addition the micro check valve is adapted to assume the closed state when the pressure difference is below the minimum pressure difference.

The expression above the diaphragm here denotes the periphery, that is to say the region of the surroundings of the top side of the diaphragm, that is to say the side of the diaphragm which is not directed towards the substrate body.

Accordingly therefore the micro check valve opens when a fluid, more specifically for example a liquid or a gas, or an aerosol is passed through the at least one passage into the first trough or first chamber and here presses against the diaphragm. Accordingly the spacing between the sealing bar or the bar seal increases so that the fluid or aerosol can flow into the second trough or second chamber and can issue from the through openings. The valve defined by the sealing bar and the diaphragm therefore opens.

The micro check valve assumes a closed state in the situation where the pressure of a fluid or an aerosol presses against the diaphragm from above so that it is pressed against the sealing bar or bar portion and the latter therefore blocks the passage between the first and second troughs. A fluid or aerosol can admittedly pass through the openings into the second trough in the closed state but does not pass further into the first chamber and the at least one passage. The valve defined by the sealing bar and the diaphragm therefore closes.

If no pressure difference is acting on the diaphragm then the micro check valve is correspondingly disposed in a position which is defined by a prestressing of the diaphragm and which preferably corresponds to the closed state. Admittedly there can be a small spacing between the sealing bar or the bar portion and the diaphragm to prevent adhesion effects, in which case, in the presence of liquid, the diaphragm is attracted to the substrate body by van der Waals forces and thereby at any event a closed state is attained. In regard to gases, in that case, that is to say in the closed state, a small amount of gas would escape through the micro check valve.

In a further embodiment the sealing bar at its top side has a plane which is deeper in the substrate body than the plane of the substrate body in the region outside the second trough which is formed on the top side of the substrate body. The last-mentioned region outside the second trough corresponds to the region which is outside an outside diameter of the second trough and thus corresponds to an outer trough edge.

As a result a small spacing which can also be referred to as a gap, preferably of a few micrometers, is produced between the substrate body in the region between the sealing bar and the diaphragm, in particular the sealing surface of the bar and the diaphragm, so that adhesion effects between the diaphragm and the sealing bar which can have the result that the check valve does not open are reduced. Reliable opening and closing of the micro check valve is thus possible.

According to a further embodiment the diaphragm has a plurality of through openings arranged above the second trough, that is to say in the region of the diaphragm which is above the second trough. Those through openings are arranged distributed in such a way as to produce defined spray directions or a predefined preferential spray direction of a fluid or aerosol passed through the through openings. A preferential spray direction here is the spray direction into which the in total greatest amount of a fluid or aerosol is conveyed or which is afforded by summing of the directional vectors of the individual spray directions.

Accordingly the micro check valve can be used at the same time as a spray head, wherein by virtue of selection of the preferential spray direction the orientation can be taken into consideration when installing the micro check valve in a system. The micro check valve can thus be used as an integrated system with check valve function and spray head function.

According to a further embodiment at least one or all through openings is or are round and/or at least one or all through openings is or are oval and at least one or all through openings is or are trapezoidal, angular, triangular, polygonal with rounded corners.

In that way it is possible to set one or more predefined spray directions or a preferential spray direction in the case of an opened micro check valve and a fluid or aerosol which is passed through the check valve, in which case the spray direction can also be produced by a plurality of identical or a plurality of different shapes of the through openings. At the same time by virtue of the specified shapes the through openings do not have any corners at which stresses and thus cracks could occur. This therefore promotes longevity of the micro check valve.

According to a further embodiment the micro check valve includes at least one spring arm having a first end and a second end. The first end is connected directly or indirectly to the diaphragm in the region in which the diaphragm is moveable and the second end is connected directly or indirectly to the substrate body.

If the second end is connected indirectly to the substrate body, for example by way of a portion of the diaphragm, then the second end is connected to the substrate body by way of the diaphragm in the region which is not moveable, being therefore rigidly connected to the substrate body. The spring arm or arms provide that the diaphragm can be moved into a predefined rest position in dependence on a prestressing of the spring arm or arms, in which case the minimum pressure difference for switching over the micro check valve can also be controlled or adapted.

For that purpose the spring arm or arms comprise a material which has a prestressing in order to exert a predefined spring force. For example the spring arm is deposited by a process so that a stress occurs in the material, which is produced in controlled fashion in such a way that the prestressing is generated thereby. Advantageously the spring arm or arms comprise oxidized polysilicon for that purpose.

In a further embodiment the diaphragm at least in parts of the moveable region of the diaphragm which is above the troughs and the sealing bar includes a stiffening structure which for example is a plate, a ring or a grid or lattice. The stiffening element is formed from a layer which is deposited in addition to the diaphragm. Preferably the stiffening element is deposited in a deposition process together with the spring arm or arms. The first end of the at least one spring arm is connected indirectly to the diaphragm by way of the stiffening element.

A more uniform distribution of force, in particular of a plurality of spring arms, on the diaphragm is possible by virtue of the stiffening element so that no point loading on the diaphragm is generated and the diaphragm is not damaged by the exertion of the force by the spring arm and a counteracting force by a fluid pressure or an aerosol pressure which is exerted on the diaphragm.

The stiffening element and the spring arm or arms are advantageously deposited in a common step by a deposition process, preferably of polysilicon, and thereafter oxidized. A stress can be generated in the polysilicon by the oxidation, with which the spring force of the spring arm or arms can be adjusted.

According to a further embodiment the at least one spring arm is adapted to exert a force on the moveable region of the diaphragm, which acts in the direction towards the substrate body. Therefore the micro check valve is always reliably held closed, even if no pressure acts on the diaphragm because of a fluid or an aerosol.

According to a further embodiment the thickness of the diaphragm and/or the spring force of the at least one spring arm and/or the size of the surface area and/or the number of through openings in the diaphragm is so selected as to provide a predefined minimum pressure difference, that is to say a predefined opening pressure and/or a predefined closing pressure, as well as a predefined through-flow amount. An opening pressure and/or closing pressure can be predefined by an application and is preferably described by the above-mentioned minimum pressure difference.

By virtue of a variation in the thickness of the diaphragm, the spring force of the spring arms and/or the area of the at least one through opening it is thus possible in a simple fashion to define a desired closing and/or opening pressure.

In addition, according to further embodiments, the invention includes a system having a plurality of micro check valves according to one of the above-mentioned embodiments. In that case the micro check valves have a common substrate body. Accordingly the system is also to be referred to as a monolithic system.

According to an embodiment of the system the through openings in the diaphragms of the plurality of micro check valves of the system are arranged distributed in such a way as to produce a predefined preferential spray direction of a fluid or aerosol passed through the through openings.

In addition, according to additional embodiments, the invention includes a method for the production of a micro check valve, in particular according to one of the above-mentioned embodiments, in particular for a system according to one of the above-mentioned embodiments.

For the production method firstly a first oxide layer which in particular is round and a second oxide layer which in particular is annular are produced on the top side of a substrate body which has a top side and an underside. In a further step a layer is deposited on the top side of the substrate body to form a diaphragm at least above the first oxide layer and the second oxide layer. In the next step through openings are etched in the diaphragm in the region above the second oxide layer and in the subsequent step at least one passage is etched from the underside of the substrate body to the first oxide layer. The two last-mentioned steps can also be carried out in the reverse sequence. Lastly the oxide layers are removed.

Accordingly a micro check valve can be produced inexpensively and in the simple fashion by in particular few steps. The first oxide layer, after removal of the oxide, becomes a first trough and correspondingly the second oxide layer, after removal of the oxide, becomes a second trough.

In an embodiment of the method after production of the first and second oxide layers and prior to deposition of the diaphragm a third oxide layer is produced in the region between the first oxide layer and the second oxide layer. In that way the gap already mentioned above is produced in a simple fashion. Alternatively in that step an oxide layer can also be formed over the first oxide layer, the second oxide layer and in the interposed region, by deposition. That accelerates the step of removing the oxide layers.

According to an embodiment of the method the third oxide layer for producing a sealing bar between the first and second troughs, in particular for a seal, is produced in a thickness which is less than the thickness of the first and/or second oxide layer. That later results in the production on the sealing bar of a plane which is deeper than the plane of the substrate body outside the second trough.

According to a further embodiment of the method the diaphragm is deposited with a layer thickness which is dependent on a predetermined least pressure difference, which can also be referred to as the minimum pressure difference, for opening and closing of the micro check valve. Accordingly the minimum pressure difference for switching of the micro check valve can thus be defined directly by adjustment of the layer thickness.

In a further embodiment of the method after conclusion of the above-mentioned steps oxidation of the structure produced is carried out. In that way on the one hand the open structures, in particular between the diaphragm and the sealing bar, can be reduced in size to produce improved sealing integrity of the check valve in the blocking direction. At the same time this produces a defined oxide layer surface which is particularly stable in relation to varying external influences like temperature and moisture and is therefore suitable for medical applications.

BRIEF DESCRIPTION OF THE DRAWINGS

Various additional features and advantages of the invention will become more apparent to those of ordinary skill in the art upon review of the following detailed description of one or more illustrative embodiments taken in conjunction with the accompanying drawings. The accompanying drawings, which are incorporated in and constitute a part of this specification, illustrate one or more embodiments of the invention and, together with the general description given above and the detailed description given below, explain the one or more embodiments of the invention.

DETAILED DESCRIPTION

Figure 1:
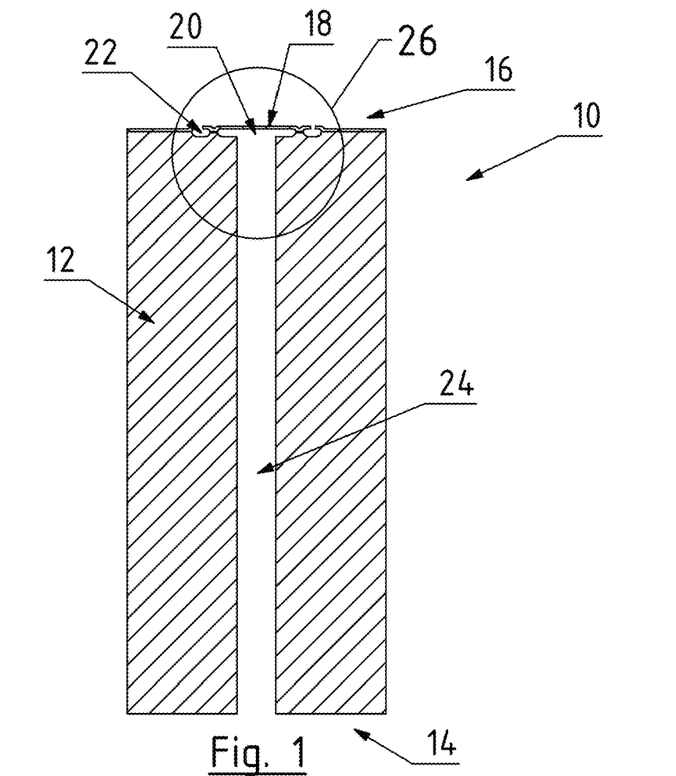
FIG. 1 shows a cross sectional view of a micro check valve according to a first embodiment.

FIG. 1 shows a sectional view of a micro check valve 10 according to a first embodiment. It is possible to see here a substrate body 12 having an underside 14 and a top side 16. A layer, for example of nitride, which forms a diaphragm 18, has been deposited on the top side 16. The substrate body 12 has recesses so that a first chamber 20 and a second chamber 22 are formed by the recesses together with the diaphragm 18, between the diaphragm 18 and the substrate body 12.

In addition a passage 24 passes through the substrate 12. The region 26 illustrated by the circle is shown on an enlarged scale in FIG. 2. In a further embodiment which is not shown here there are a plurality of passages 24.

Figure 2:
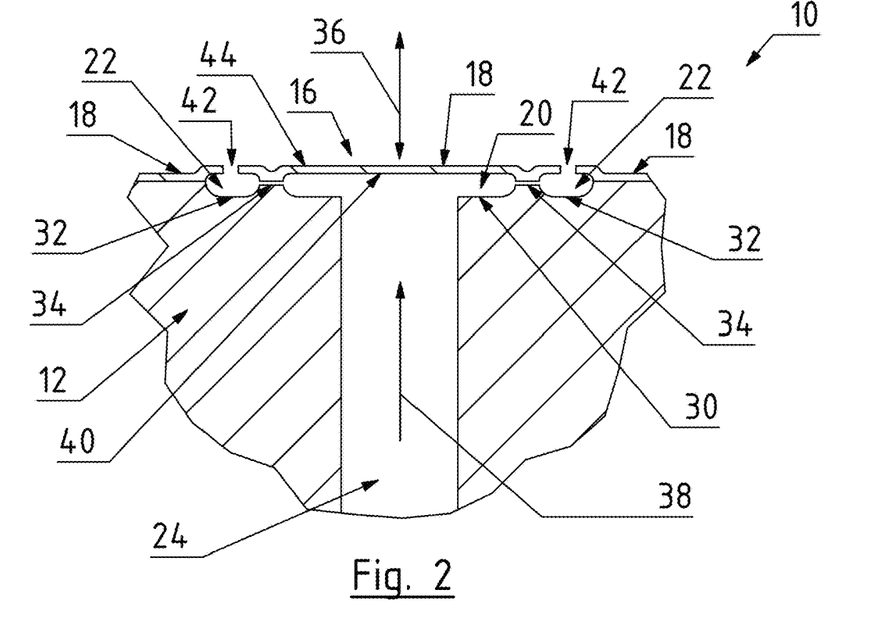
FIG. 2 shows an enlarged view of a top portion of the micro check valve shown in FIG. 1.

Accordingly FIG. 2 shows the substrate body 12 on which a diaphragm 18 was produced by deposition. The substrate body 12 has a round recess corresponding to a first trough 30 and together with the diaphragm 18 forming the first chamber 20. In addition the substrate body has an annular recess corresponding to a second trough 32. The second trough 32 is arranged to extend around the first trough 30 such that the second trough 32 surrounds the round recess or trough 30. The second trough 32 with the diaphragm 18 accordingly forms a second surrounding chamber 22. The round or annular configuration of the troughs 30, 32 respectively cannot be seen in the sectional view shown here but will be clear in following FIGS. 3 and 4.

Formed between the second trough 32 and the first trough 30 is a sealing bar 34 in the form of a bar portion extending from the substrate 12, which remains after production of the two recesses or troughs. The passage 24 extending from the underside 14 which is not shown here in relation to FIG. 1 to the top side 16 of the substrate body 12 ends in the first trough 30. If in accordance with the above-mentioned further embodiment (not shown) there are a plurality of passages 24 then all passages 24 extend from the underside 14 to the top side 16 of the substrate body 12 and end in the first trough 30.

In the region of the sealing bar 34 the diaphragm 18 and the substrate body 12 are spaced with a predefined spacing which is a few micro- or nanometers. The spacing at any event is small in comparison with the spacing of the diaphragm 18 relative to the substrate body 12 in the region of the troughs 30, 32.

In the region of the first trough 30 and in the region of the sealing bar 34 the diaphragm 18 is flexible and moveable in a direction 36 forming a normal or a normal vector to the surface of the substrate body 12. If a fluid or an aerosol flows in the direction 38 through the passage 24 to the diaphragm 18 it presses against the diaphragm 18 from the underside 40 thereof. The spacing of the diaphragm 18 relative to the substrate body 12 in the region of the sealing bar 34 increases so that a fluid or aerosol can flow from the chamber 20 into the chamber 22 and can flow out through a set of through openings 42 arranged in the region of the diaphragm 18 above the second trough 32.

If in contrast a fluid or an aerosol presses against the top side 44 of the diaphragm 18 then the diaphragm 18 is pressed against the substrate body 12 in the region of the sealing bar 34 so that the communication between the chambers 20 and 22 is closed and thus a return flow or backflow is prevented or at least reduced.

Figure 3:
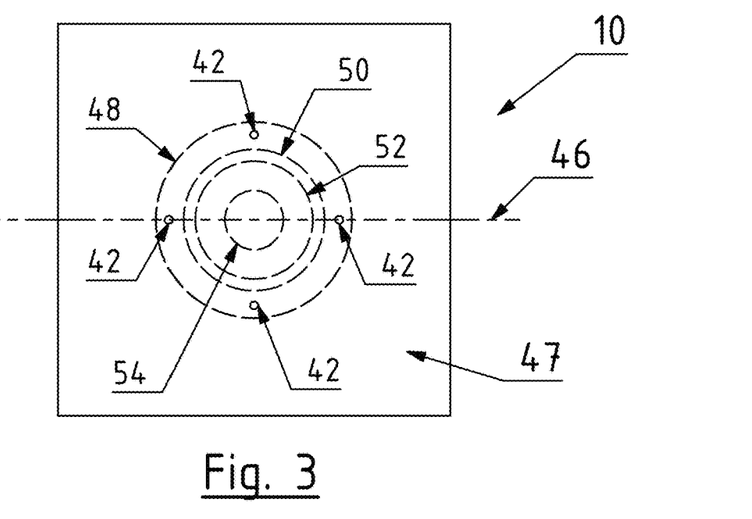
FIG. 3 shows a top plan view of the micro check valve of FIGS. 1 and 2.

FIG. 3 shows a plan view of the micro check valve 10 of FIGS. 1 and 2. In this embodiment by way of example there are four through openings 42. The embodiment described with reference to FIGS. 1 to 3 however can also have a different number of through openings in further embodiments. The line 46 in this case shows the section line, along which the section in FIG. 1 is shown. The region of the diaphragm 18, that is over the second trough 32, is represented by the broken lines 48 and 50. The region of the diaphragm 18 above the first trough 30 is represented by the broken line 52 and thus the region of the diaphragm 18, that is above the sealing bar 34, is represented by the broken lines 50 and 52.

The broken line 54 shows the region of the diaphragm 18, that is above the passage 24. The diaphragm 18 is moveable in the normal direction relative to the plane of the drawing at least within the broken line 48 which can be referred to as the outside circle diameter of the second trough 32 and thus the starting region of an outer trough edge 47 while the diaphragm 18 is fixedly or immovably connected to the substrate body 12 outside the broken line 48, that is to say in the region of the outer trough edge 47. In addition the section in FIG. 1 is shown as a perspective view in FIG. 4.

FIG. 4 accordingly again shows the substrate body 12 and the diaphragm 18. The same references as used in preceding FIGS. 1 to 3 correspond to the same features.

Figure 5A:
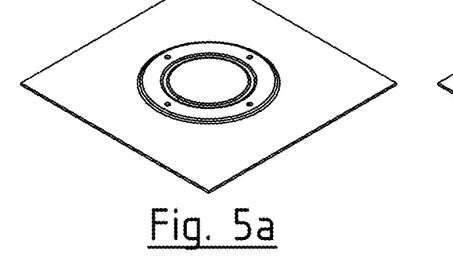
FIG. 5a is a top perspective view of the top side of one of a set of different micro check valves with different configurations of the through openings.
Figure 5B:
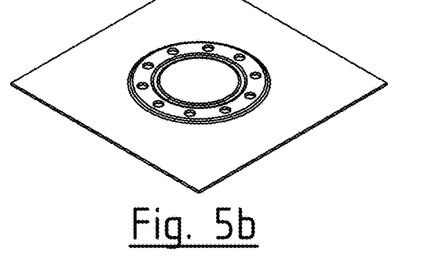
FIG. 5b is a top perspective view of the top side of another of a set of different micro check valves with different configurations of the through openings.
Figure 5C:
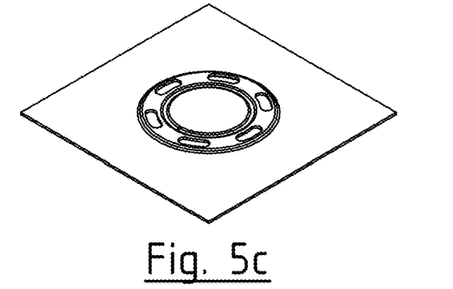
FIG. 5c is a top perspective view of the top side of yet another of a set of different micro check valves with different configurations of the through openings.

FIGS. 5a to 5c respectively show the top side 16 of a micro check valve 10, wherein the various embodiments have different numbers and shapes of the through openings 4.

FIG. 5a shows four round through openings 42 distributed uniformly above the second trough 32. FIG. 5b shows a multiplicity of round through openings 42 which are arranged uniformly on the diaphragm 18 in the region above the second trough 32 and FIG. 5c shows six oval through openings 42 arranged uniformly over the surface of the circular ring above the second trough 32.

The various arrangements, shapes and numbers of the through openings 42 make it possible to set a given preferential spray direction as well as control of the through-flow amount and a minimum pressure difference for opening or closing of the valve. Accordingly the micro check valve 10 can also be used directly as a spray head.

Figure 4:
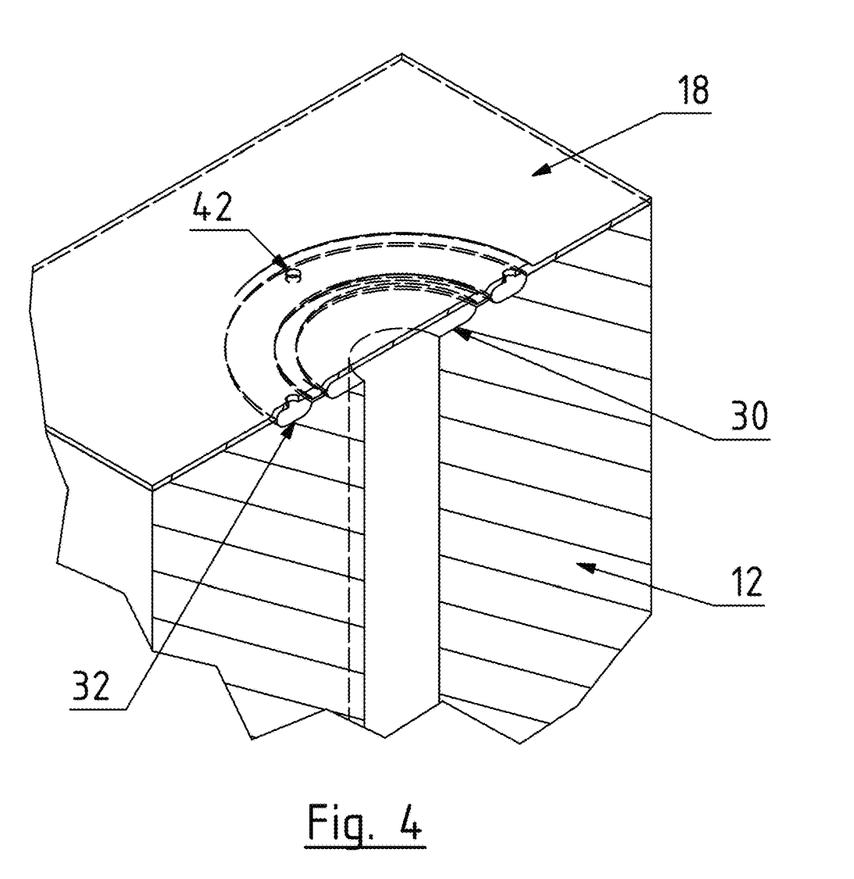
FIG. 4 shows a perspective cross sectional view of the micro check valve of FIGS. 1 to 3.
Figure 6:
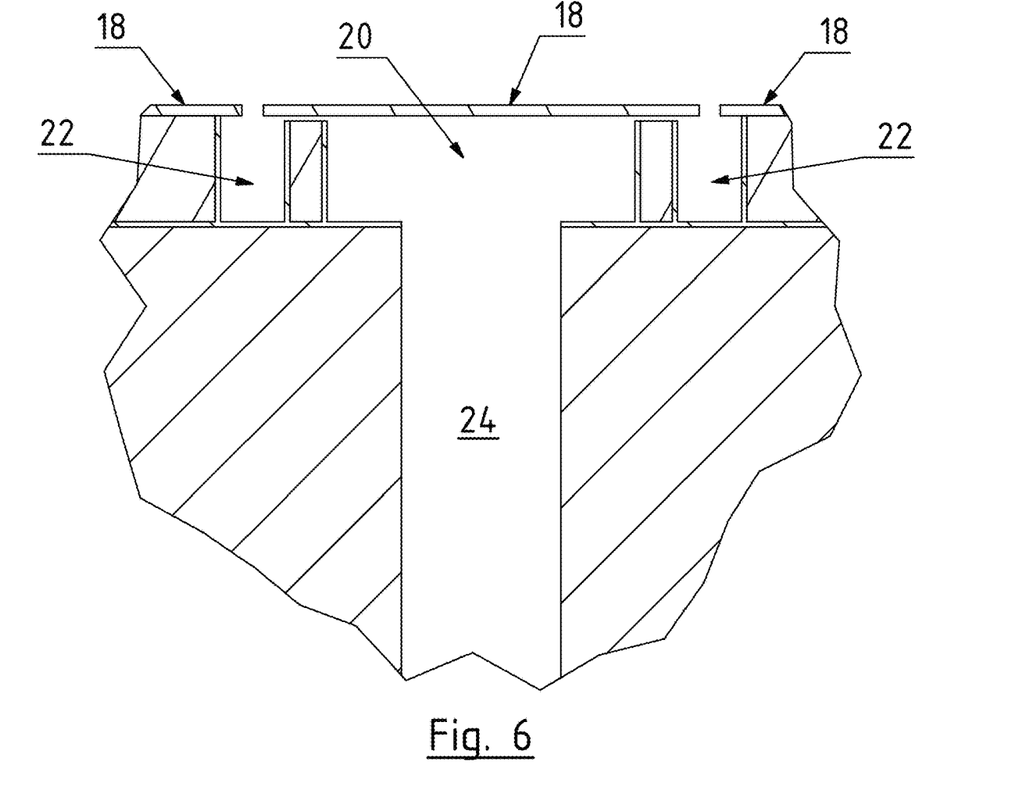
FIG. 6 shows a cross sectional view of a further embodiment of a check valve.

FIG. 6 shows an alternative configuration of the micro check valve 10 which is produced by an alternative production technology to the production technology used for the micro check valve 10 which was shown in FIGS. 1 to 4. The same references however correspond to the same features as shown in FIGS. 1 and 4.

Figure 7:
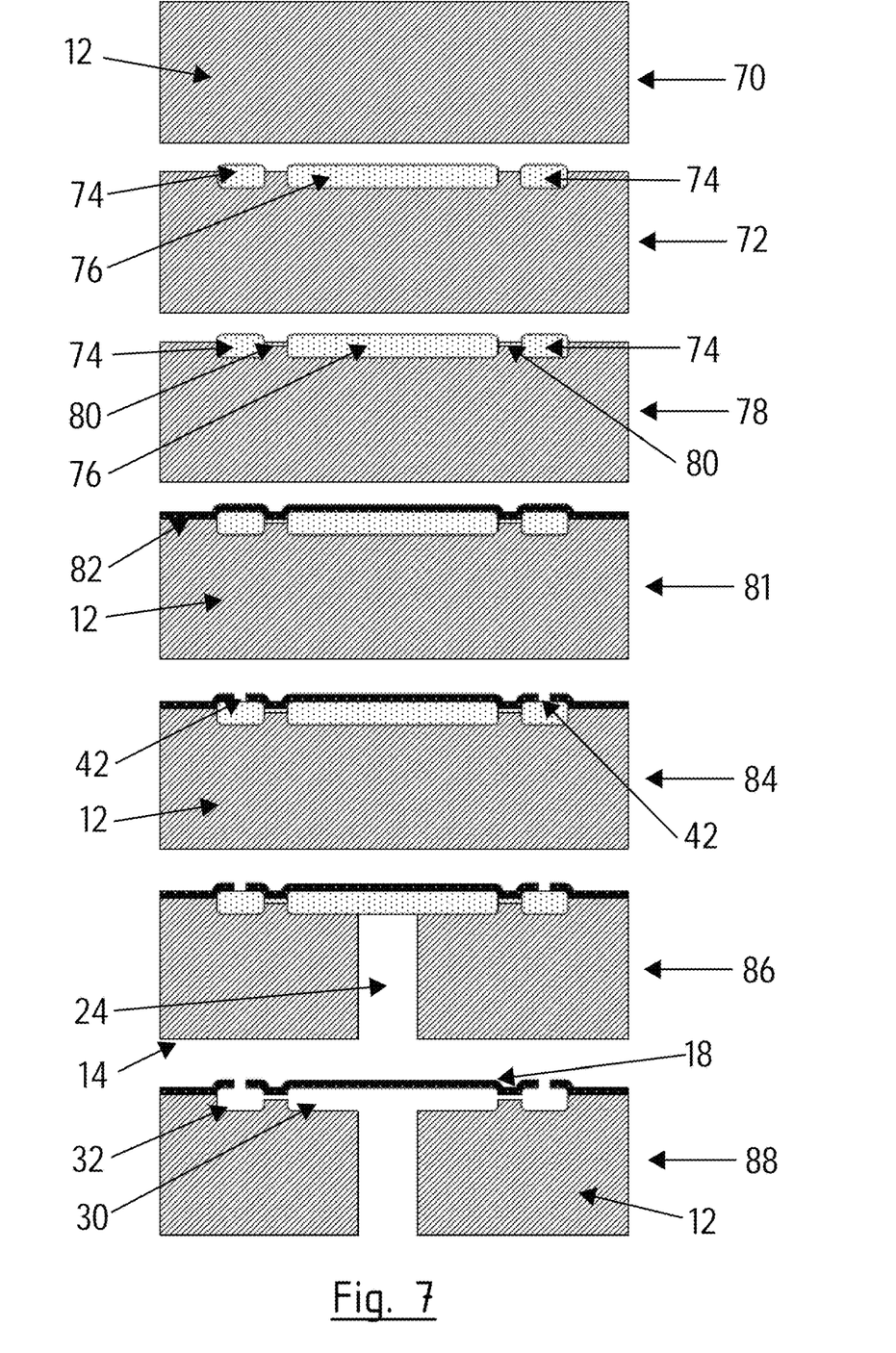
FIG. 7 shows a series of steps (sequential from top to bottom) for production of a micro check valve according to an embodiment.

FIG. 7 shows the steps for the production of a micro check valve 10 according to an embodiment of the method. In this case a substrate body 12 is produced in step 70. In step 72 a first oxide layer 76 which is preferably round and a second oxide layer 74 which is preferably annular are produced, preferably by a LOCOS process (Local Oxidation of Silicon). In step 78 a third oxide layer 80 is produced between the previously produced first oxide layer 76 and second oxide layer 74, preferably being annular. The third oxide layer 80 is preferably also produced by a LOCOS process, but the third oxide layer is produced in a smaller thickness. Then in step 81 a layer 82, for example a silicon nitride, is deposited, forming a diaphragm 18 for the later check valve 10. Above the second oxide layer 74 through openings 42 are produced in the deposited layer 82 while in step 86 a passage 24 is etched through the substrate body 12 from an underside 14 of the substrate body 12 to the first oxide layer 76. The oxide layers 74, 76, 80 are then removed in step 88 by sacrificial layer etching.

Figure 8:
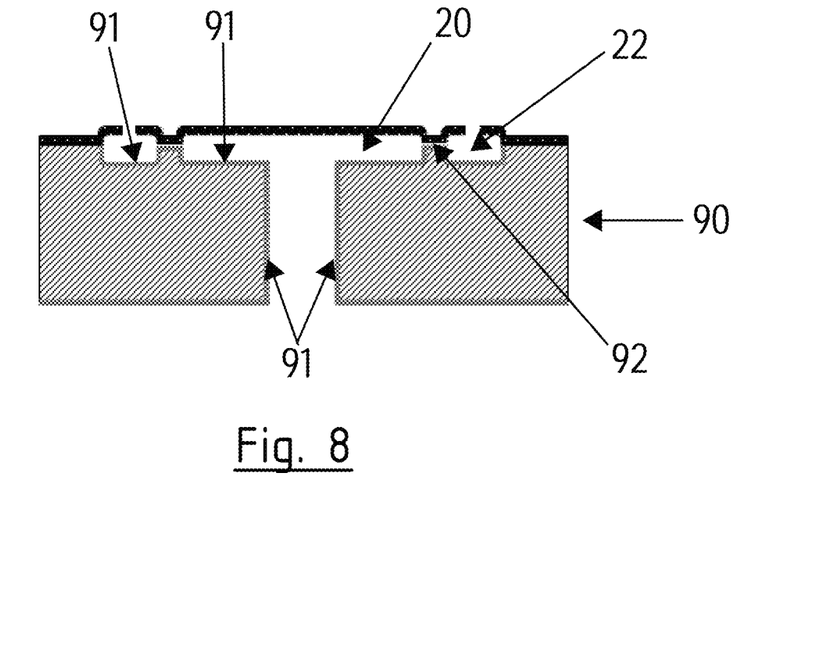
FIG. 8 shows an additional step of the method shown in FIG. 7 for the production of a micro check valve according to a further embodiment.

FIG. 8 shows an additional step 90 to the steps shown in FIG. 7, by which, in a further embodiment, a further oxide layer 91 is produced over the structure of the micro check valve, in particular in the interior thereof. For that purpose, after step 88 in which the oxide layers are removed, the substrate is oxidized afresh. In that way the spacing 92 between the diaphragm and the sealing bar 34, which can also be referred to as the gap, is reduced to achieve a better closing action.

Figure 9:
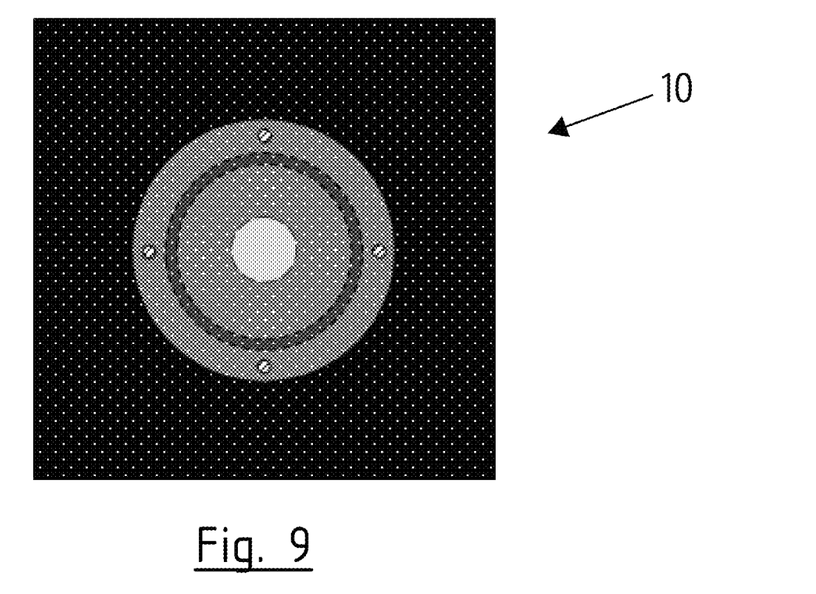
FIG. 9 shows a top plan view of a micro check valve produced with the steps shown in FIG. 7.

FIG. 9 shows a plan view of the steps illustrated in FIG. 7 and optionally the micro check valve 10 produced with the step described with reference to FIG. 8.

Figure 10:
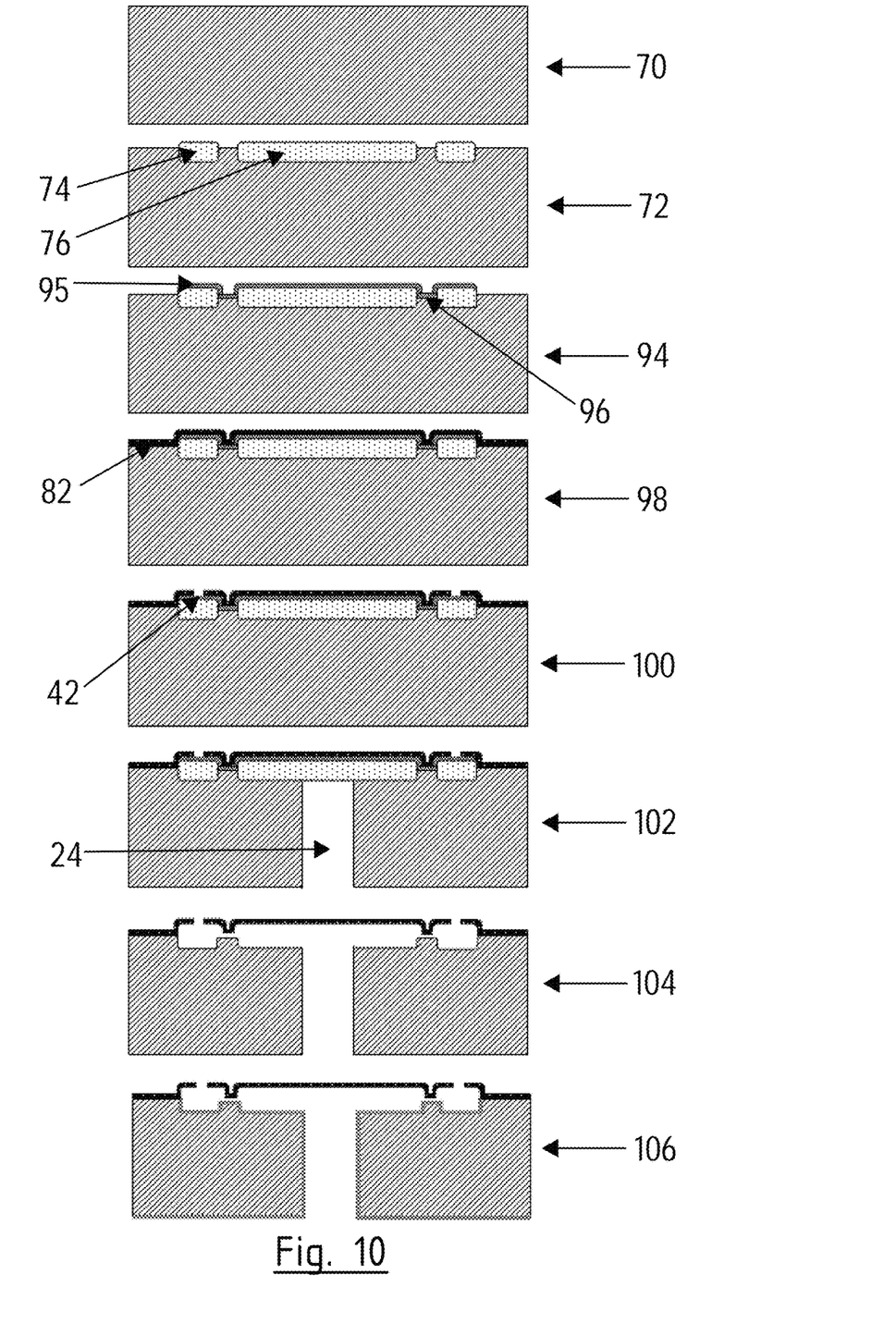
FIG. 10 shows a series of steps (sequential from top to bottom) of a further embodiment for the production of a micro check valve.

FIG. 10 shows an alternative method for the production of the micro check valve 10. Firstly a substrate body 12 is again produced in a step 70. In step 72 a first oxide layer 76 which is preferably round and a second oxide layer 74 which is preferably annular are produced. The first oxide layer 70 and the second oxide layer 74 are preferably produced by a LOCOS process. In step 94 however an oxide layer 95 is now deposited in the region over the first oxide layer 76, the second oxide layer 74 and the interposed region 96, by a deposition process, for example an LPCVD process. Thereupon steps 98, 100, 102, 104 and 106 are carried out like steps 81, 84, 86, 88 and 90.

Accordingly therefore in step 98 a layer 82, for example a silicon nitride, is deposited, forming the diaphragm 18 for the later check valve 10. Then in step 100 through openings 42 are produced in the deposited layer 82 above the second oxide layer 74 while in step 102 a passage 24 is etched through the substrate body 12 from an underside 14 of the substrate body 12 to the first oxide layer 76. The oxide layers 74, 76, 95 are then removed in step 104 by sacrificial layer etching. In that case now firstly the last-deposited oxide layer 95 is attacked so that removal of the remaining oxide layer can be effected substantially more quickly by virtue of the increased surface area for attacking the oxide layers. Step 104 is thus admittedly identical to step 88, but takes substantially less time for implementation thereof.

Step 106 corresponds to the optional additional step shown in FIG. 8 for producing an oxidized surface.

Figure 11:
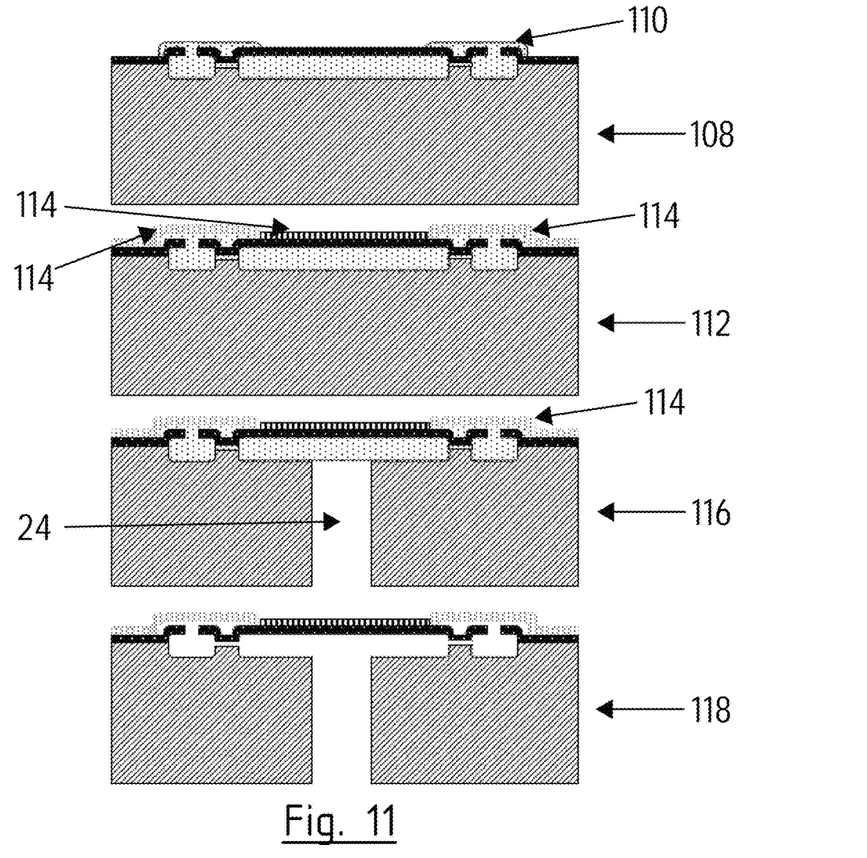
FIG. 11 shows further sequential steps from top to bottom of the method of FIG. 10, specifically for the production of spring arms and a stiffening element of a micro check valve.

FIG. 11 shows modified steps of the production described with reference to FIG. 7 for producing the spring arms and the stiffening element. In accordance therewith firstly steps 70, 72, 78, 81 and 84 are carried out as described with reference to FIG. 7. Thereupon however in a step 108 an oxide layer 110 is produced at least in an annular region which is partially above the later moveable region of the diaphragm 18. Then in step 112 a polysilicon structure 114 is produced, being of the shape of the later spring arms and the stiffening element. Thereupon in step 116 the passage 24 is etched and in step 118 the oxide layers 74, 76, 80 and 110 are removed.

Figure 12:
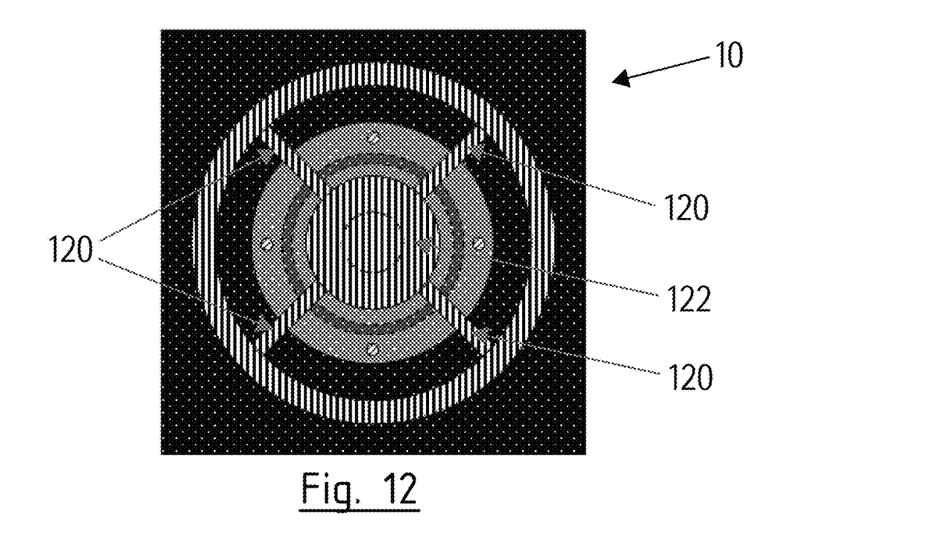
FIG. 12 shows a top plan view of a micro check valve with spring arms and a stiffening element, which is produced with the steps shown in FIG. 11.

FIG. 12 shows a plan view of the micro check valve which is produced involving the steps described with reference to FIG. 11. Here now the spring arms 120 and the stiffening element 122 are produced in comparison with FIG. 9.

The embodiments described above are only descriptions of preferred embodiments of the present invention, and are not intended to limit the scope of the present invention. Various modifications can be made to the technical solution of the present invention by those of ordinary skill in the art, without departing from the design and spirit of the present invention. The variations and modifications should all fall within the claimed scope defined by the claims of the present invention.

LIST OF REFERENCES 10 micro check valve
12 substrate body
14 underside of the substrate body
16 top side of the substrate body
18 diaphragm
20 first chamber
22 second chamber
24 passage
26 region
30 first trough
32 second trough
34 sealing bar
36, 38 directions
40 underside of the diaphragm
42 through openings
44 top side of the diaphragm
46 section line 47 outer trough edge
48-54 broken lines
70, 72, 78 steps in the method
74 second oxide layer
76 first oxide layer
80 third oxide layer
81 step in the method
82 deposited layer
86, 88, 90 steps in the method
91 further oxide layer
92 spacing or gap
94 step
95 oxide layer
96 region
98-108 steps
110 oxide layer
112 step
114 polysilicon structure
116, 118 steps
120 spring arms
122 stiffening element

What is claimed is:

1. A micro check valve comprising a substrate body having a top side and an underside, wherein
the top side includes a first trough and a second trough with a sealing bar between the first trough and the second trough, the first trough having a round shape as a result of being defined at a first oxide layer that is round when produced on the top side and later removed to open the first trough, the second trough having an annular shape as a result of being defined at a second oxide layer that is annular when produced on the top side and later removed to open the second trough, and the sealing bar being defined by one of (a) a third oxide layer produced in a region between the first oxide layer and the second oxide layer, or (b) an oxide layer that is deposited in a region over the first oxide layer, the second oxide layer, and in the region between the first oxide layer and the second oxide layer, and
the substrate body has at least one passage which leads from the underside of the substrate body to the top side of the substrate body and ends in the first trough, and
arranged on the top side of the substrate body is a deposited diaphragm which is flexible at least in a region above the first trough, the second trough and the sealing bar to move at least in a direction of a normal vector to the surface of the substrate body with respect to the substrate body, and
the diaphragm has at least one through opening arranged in a region of the diaphragm, that is arranged above the second trough, and
the oxide layer that is to define the sealing bar is formed on the top side of the substrate body before the diaphragm is deposited on the top side of the substrate body.

2. The micro check valve of claim 1, wherein the first trough is a first round recess in the substrate body and the second trough is a second annular recess extending around the first round recess in the substrate body, and the first trough is separated from the second trough extending around the first trough by the sealing bar, wherein the sealing bar is annular.

3. The micro check valve of claim 2, wherein the first trough is a circular recess, the second trough is a circular-annular recess, and the sealing bar is circular-annular.

4. The micro check valve of claim 1, wherein the first trough with the diaphragm defines an inner chamber and the second trough with the diaphragm defines an outer chamber, and the sealing bar forms a sealing element adapted together with the diaphragm substantially to prevent a fluid flow and aerosol flow between the inner chamber and the outer chamber.

5. The micro check valve of claim 1, wherein the micro check valve has an opened state and a closed state and is adapted to assume the opened state when a pressure difference of a fluid or aerosol between a pressure in the passage and a pressure above the diaphragm is at or over a predefined minimum pressure difference and to assume a closed state when the pressure difference is below the predefined minimum pressure difference.

6. The micro check valve of claim 1, wherein at a top side the sealing bar defines a sealing surface, which is deeper in the substrate body than a plane which is formed by the top side of the substrate body and which is at least outside an outside diameter of the second trough.

7. The micro check valve of claim 1, wherein the diaphragm has a plurality of through openings arranged above the second trough distributed so as to produce a plurality of predefined spray directions or a predefined preferential spray direction of a fluid or aerosol passed through the through openings.

8. The micro check valve of claim 1, wherein at least one or all through openings are round, oval, or one of trapezoidal, angular, triangular, polygonal with rounded corners.

9. The micro check valve of claim 1, wherein the micro check valve has at least one spring arm having a first end and a second end, wherein the first end is directly or indirectly connected to the diaphragm in a region in which the diaphragm is moveable and the second end is connected to the substrate body, and the spring arm is produced from oxidized polysilicon.

10. The micro check valve of claim 9, wherein the diaphragm at least in the moveable region of the diaphragm has a stiffening element which is formed from a layer provided as an addition to the diaphragm and corresponds to a grid, a ring or a plate, and the first end of the at least one spring arm is indirectly connected to the diaphragm by the stiffening element.

11. The micro check valve of according to claim 9, wherein the at least one spring arm is adapted to apply a force to the moveable region of the diaphragm, that acts in a direction of the substrate body.

12. The micro check valve of claim 9, wherein at least one of a thickness of the diaphragm, a spring force of the at least one spring arm, an area of the moveable part of the diaphragm, and a number of through openings in the diaphragm is selected so as to provide a predefined opening pressure, a predefined closing pressure and a predefined through-flow quantity.

13. A system comprising:
a plurality of the micro check valves of claim 1,
wherein the micro check valves have a common substrate body.

14. The system of claim 13, wherein the through openings are arranged and distributed in such a way to produce predefined spray directions and a predefined preferential spray direction of a fluid or aerosol passed through the through openings.

15. A method for production of a micro check valve, including the steps:
(a) producing a first oxide layer which is round and a second oxide layer which is annular on a top side of a substrate body which has a top side and an underside, (b) depositing a layer on the top side of the substrate body to form a diaphragm at least above the first oxide layer and the second oxide layer,
(c) etching through openings in the diaphragm in a region above the second oxide layer,
(d) etching at least one passage from the underside of the substrate body to the first oxide layer, and
(e) removing the first and second oxide layers,
wherein before step (b), at least one of the following further steps is conducted:
a third oxide layer is produced in a region between the first oxide layer and the second oxide layer, and
an oxide layer is deposited in a region over the first oxide layer, the second oxide layer and in a region between the first oxide layer and the second oxide layer by a deposition process.

16. The method of claim 15, wherein the third oxide layer of an annular region is produced for a spacing of a thickness less than the thickness of the first oxide layer and the second oxide layer.

17. The method of claim 15, wherein the diaphragm is deposited with a layer thickness which is dependent on a predefined minimum pressure difference for opening and closing of the micro check valve.

18. The method of claim 15, wherein after step (e), oxidation of the structure is carried out.

* * * * *